(12) United States Patent
Wang

(10) Patent No.: US 10,866,680 B2
(45) Date of Patent: Dec. 15, 2020

(54) TOUCH PANEL WITH SINGLE PLATE AND MANUFACTURING METHOD THEREOF

(71) Applicant: Wistron Corporation, New Taipei (TW)

(72) Inventor: Kuei-Ching Wang, New Taipei (TW)

(73) Assignee: Wistron Corporation, New Taipei (TW)

( * ) Notice: Subject to any disclaimer, the term of this patent is extended or adjusted under 35 U.S.C. 154(b) by 29 days.

(21) Appl. No.: 15/810,161

(22) Filed: Nov. 13, 2017

(65) Prior Publication Data
US 2018/0077827 A1 Mar. 15, 2018

Related U.S. Application Data

(62) Division of application No. 13/895,356, filed on May 16, 2013, now abandoned.

(30) Foreign Application Priority Data

May 18, 2012 (TW) ............................. 101117869 A

(51) Int. Cl.
G06F 3/044 (2006.01)
H05K 3/12 (2006.01)
G06F 3/041 (2006.01)
H05K 9/00 (2006.01)

(52) U.S. Cl.
CPC ............ *G06F 3/044* (2013.01); *G06F 3/0416* (2013.01); *H05K 3/12* (2013.01); *G06F 3/0443* (2019.05); *G06F 2203/04103* (2013.01); *G06F 2203/04111* (2013.01); *H05K 9/00* (2013.01); *Y10T 156/10* (2015.01)

(58) Field of Classification Search
CPC .......... H05K 9/00; H05K 3/12; G06F 3/0416; G06F 3/044; G06F 2203/04103; G06F 2203/04111; Y10T 156/10; G09F 3/0416
USPC .......................................... 345/173–174, 177
See application file for complete search history.

(56) References Cited

U.S. PATENT DOCUMENTS

| | | | |
|---|---|---|---|
| 2002/0192572 A1* | 12/2002 | Lau ........................... | G03F 1/50 430/5 |
| 2006/0278853 A1* | 12/2006 | Yang ......................... | B41M 1/12 252/500 |
| 2008/0074398 A1* | 3/2008 | Wright ...................... | G06F 3/044 345/173 |
| 2010/0045613 A1* | 2/2010 | Wu ............................ | G06F 3/044 345/173 |
| 2010/0147561 A1* | 6/2010 | Uchiyama .............. | H05K 3/284 174/251 |
| 2010/0214247 A1* | 8/2010 | Tang ........................ | H03K 17/98 345/173 |
| 2011/0043465 A1* | 2/2011 | Huang ................ | H03K 17/9645 345/173 |
| 2011/0128246 A1* | 6/2011 | Esaka .................. | G02F 1/13338 345/173 |
| 2011/0227858 A1* | 9/2011 | An ............................ | G06F 3/044 345/174 |
| 2011/0234509 A1* | 9/2011 | Lee ......................... | H01L 27/323 345/173 |

(Continued)

*Primary Examiner* — Kent W Chang
*Assistant Examiner* — Sujit Shah
(74) *Attorney, Agent, or Firm* — Winston Hsu

(57) ABSTRACT

A touch panel with a single plate includes a plate and a sensing circuit structure. The substrate is taken as a cover. The sensing circuit structure is formed on the plate.

17 Claims, 8 Drawing Sheets

(56) References Cited

U.S. PATENT DOCUMENTS

| | | | | |
|---|---|---|---|---|
| 2011/0234526 A1* | 9/2011 | Mi | ............................ | H05K 3/30 345/174 |
| 2011/0272260 A1* | 11/2011 | Wallace | ................ | H03K 17/962 200/300 |
| 2011/0291987 A1* | 12/2011 | Wang | ....................... | G06F 3/044 345/174 |
| 2011/0298750 A1* | 12/2011 | Wang | ..................... | G06F 3/0412 345/174 |
| 2011/0304582 A1* | 12/2011 | Ho | .......................... | G06F 3/044 345/174 |

\* cited by examiner

TOUCH PANEL WITH SINGLE PLATE AND MANUFACTURING METHOD THEREOF

CROSS REFERENCE TO RELATED APPLICATIONS

This is a divisional application of U.S. patent application Ser. No. 13/895,356, which was filed on May 16, 2013 and entitled "TOUCH PANEL WITH SINGLE PLATE AND MANUFACTURING METHOD THEREOF", which is included in its entirety herein by reference.

BACKGROUND OF THE INVENTION

1. Field of the Invention

The present invention relates to an input panel and a manufacturing method thereof, and more particularly, to a touch panel and a manufacturing method thereof.

2. Description of the Prior Art

Various types of touch input devices have been widely used in electronic products. For example, a mobile phone or a tablet PC utilizes a touch panel as an input device, and a user may easily touch on a surface of the input panel with hands to give commands, or slides on the surface of the touch panel to operate a cursor or perform handwriting input. A display panel together with the touch panel may also display virtual buttons for the user to select, and the user may enter corresponding texts by the virtual buttons.

In general, the touch panels are divided into resistive touch panels, capacitive touch panels, ultrasonic touch panels, infrared touch panels, etc, and the resistive touch panels have the most products. The resistive touch panels are mainly divided into four-wire, five-wire, six-wire, and eight-wire, etc. Since costs and technical aspects of the four-wire touch panels are more mature, the four-wire touch panels have been widely produced and applied.

The touch panel includes two substrates, a circuit layer, an insulation layer, and flexible printed circuit board (PCB) patterns. The circuit layer, the insulation layer, and the flexible PCB patterns are formed on one of the two substrates and are disposed between the two substrates. For common types of the two substrates, one of the two substrates is a base plate and the other is cover lens. However, the touch panel with the two substrates could have a thicker thickness and is not complied with the trend.

Therefore, providing a thinner touch panel and a manufacturing method thereof has become an important topic.

SUMMARY OF THE INVENTION

It is therefore an objective of the present invention to provide a thin touch panel and a manufacturing method thereof, wherein by a design of a sensing circuit structure on a substrate, the single substrate may provide a touch function and additional bonding steps are eliminated. Moreover, the substrate is disposed on an operating side of the touch panel and covers internal circuits to be not exposed to an outside, so as to have a protective effect.

Another objective of the present invention provides a thin touch panel and a manufacturing method thereof, wherein in addition to have the touch and protective function, since the substrate of the touch panel cover border circuits and other components, a decorative function is further provided to avoid the circuits to be exposed and perceived.

For the above objectives, a touch panel with a single plate according to the present invention comprises a substrate and a sensing circuit structure. The substrate is taken as a cover, and the sensing circuit structure is formed on the substrate.

Another touch panel with a single plate according to the present invention comprises a substrate and a sensing circuit structure. The substrate is taken as a cover, and the sensing circuit structure is formed on the substrate and has a shielding function.

Another touch panel with a single plate according to the present invention comprises a substrate, a sensing circuit structure, and a shielding structure or a shielding body. The substrate is taken as a cover, and the sensing circuit structure and the shielding structure or the shielding body are formed on the substrate.

According to an embodiment of the present invention, the sensing circuit structure comprises a transparent conductive layer, formed on the substrate; a conductive decorative pad, formed on the transparent conductive layer; a decorative layer, formed on the transparent conductive layer and the conductive decorative pad, and having an opening on the conductive decorative pad; and a non-transparent conductive layer, formed on the decorative layer, and electrically connected with the transparent conductive layer via the opening.

According to an embodiment of the present invention, the conductive decorative pad completely covers the opening, a conductive capacity of the conductive decorative pad is superior to a conductive capacity of the decorative layer, and a color of the conductive decorative pad is similar to a color of the decorative layer.

According to an embodiment of the present invention, a part of the non-transparent conductive layer is formed on the opening; according t another embodiment of the present invention, the sensing circuit structure further comprises a conductive filler, formed on the opening; or according another embodiment of the present invention, a part of the non-transparent conductive layer and the conductive filler are formed on the opening.

According to an embodiment of the present invention, the sensing circuit structure comprises a transparent conductive layer, formed on the substrate; a shielding decorative layer, formed on the substrate and the transparent conductive layer; a transparent conductive connection layer, formed on the transparent conductive layer and the shielding decorative layer, extended from the transparent conductive layer toward the shielding decorative layer, and exceeding an edge of the transparent conductive layer; and a non-transparent conductive layer, formed on the shielding decorative layer and the transparent conductive connection layer, and not formed on the transparent conductive layer.

According to an embodiment of the present invention, the non-transparent conductive layer formed on the shielding decorative layer is extended toward the transparent conductive layer and doesn't not exceed the edge of the transparent conductive layer.

According to an embodiment of the present invention, a material of the shielding decorative layer comprises various color inks with insulation, a material of the transparent conductive layer comprises conductive polymer resin or indium tin oxide, and a material of the non-transparent conductive layer comprises silver glue, copper, molybdenum, or aluminum.

According to an embodiment of the present invention, a color of the shielding decorative layer is arbitrary but not corresponding to a color of the transparent conductive layer.

According to an embodiment of the present invention, the shielding decorative layer has an opening on the transparent conductive layer, the transparent conductive connection layer is filled into the opening, and the sensing circuit structure further comprise another shielding decorative layer, formed on the transparent conductive layer to cover the opening.

According to an embodiment of the present invention, the touch panel is a rigid or flexible touch panel.

According to an embodiment of the sensing circuit structure comprising the non-transparent conductive layer, a material of the non-transparent conductive layer comprises radiation-curable conductive material, and the non-transparent conductive layer is formed by utilizing a radiation to irradiate the radiation-curable conductive material for curing a part of the radiation-curable conductive material and removing an incurable radiation-curable conductive material, wherein a curable part of the radiation-curable conductive material is made by setting a mask on the radiation-curable conductive material to selectively cure the radiation-curable conductive material. Additionally, a material of the non-transparent conductive layer comprises nano silver or micron silver, and a material of the non-transparent conductive layer further comprises titanium, zinc, zirconium, antimony, indium, tin, copper, molybdenum or aluminum. Moreover, the non-transparent conductive layer is formed by relief printing, gravure printing, offset printing, or screen printing.

According to an embodiment of the present invention, the transparent conductive layer comprises a plurality of first transparent conductive units and a plurality of second transparent conductive units, the plurality of first transparent conductive units and the plurality of second transparent conductive units are formed on a same side of the substrate, and the plurality of first transparent conductive units and the plurality of second transparent conductive units respectively have an extending direction perpendicular to each other. Additionally, the transparent conductive layer further comprises an insulation part formed between the plurality of first transparent conductive units and the plurality of second transparent conductive units.

According to an embodiment of the present invention, the sensing circuit structure further comprises a pin; and a conductive bonding object, wherein the conductive bonding object bonds the pin and the non-transparent conductive layer, or the conductive bonding object is formed on the substrate, bonds the pin and the substrate, and electrically connects the pin and the transparent conductive layer.

The touch panel with the single plate and the multi-function of the present invention may be implemented by improving the structure of the substrate. In comparison to the prior art, the single plate provides the completely touch function, does not require bonding the cover film or cover lens by the bonding process, and may maintain a structural strength supported by the general touch panel. Thus, in addition to eliminating a requirement of utilizing another substrate to form the touch panel, the space and manufacturing cost of bonding the cover film or the cover lens is further saved to be conductive to thin the product, which belongs to a creative concept of forward-looking.

These and other objectives of the present invention will no doubt become obvious to those of ordinary skill in the art after reading the following detailed description of the preferred embodiment that is illustrated in the various figures and drawings.

DETAILED DESCRIPTION

According to related figures, a touch panel with a single plate and a manufacturing method thereof according to a preferred embodiment of the present invention are described below, wherein the same components will be illustrated as the same reference numbers.

The touch panel of the present invention has the single substrate and also has at least touch and protective functions, preferably has all of the touch, protective and decorative functions, and belongs to a creative concept of forward-looking. In addition to thinning the touch panel, since additional steps for bonding or assembling may be simplified, the touch panel of the present invention is suitable for a modular manufacturing process. Based on the above concept, the present invention may have different embodiments, and below two main structures are represented for illustration, and are not limited herein. In other words, any structure complied with the above creative concept is also covered in the scope of the present invention.

Figure 1A:
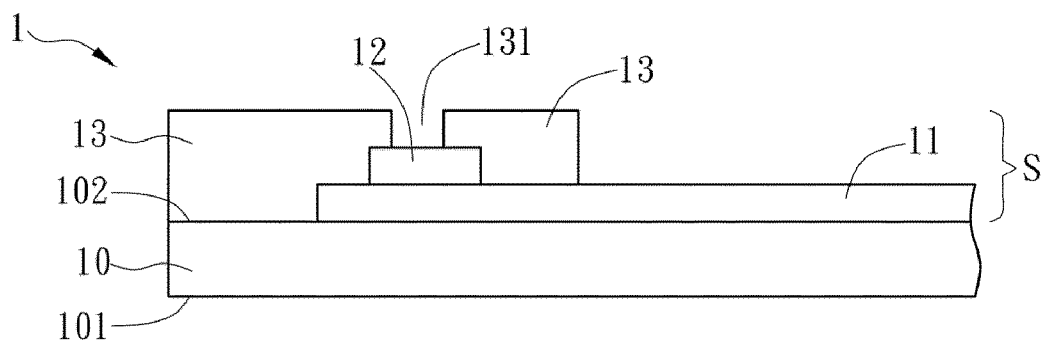
FIG. 1A-FIG. 1C illustrate schematic diagrams of a touch panel according to a preferred embodiment of the present invention.
Figure 1B:
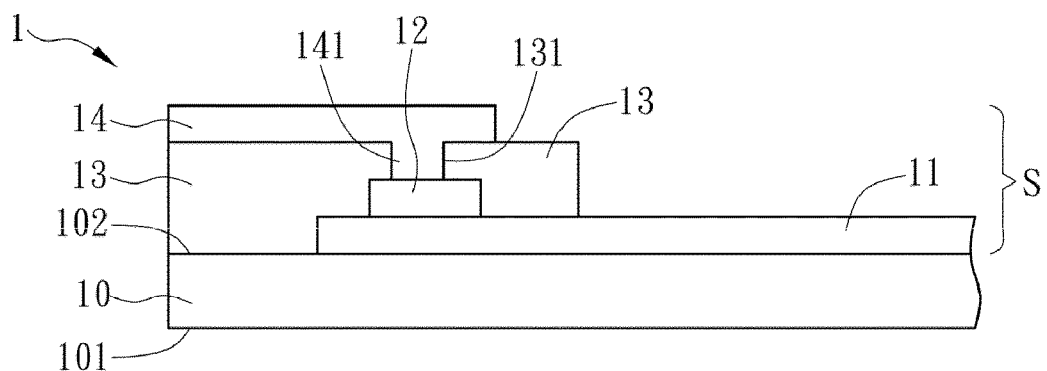
Figure 1C:
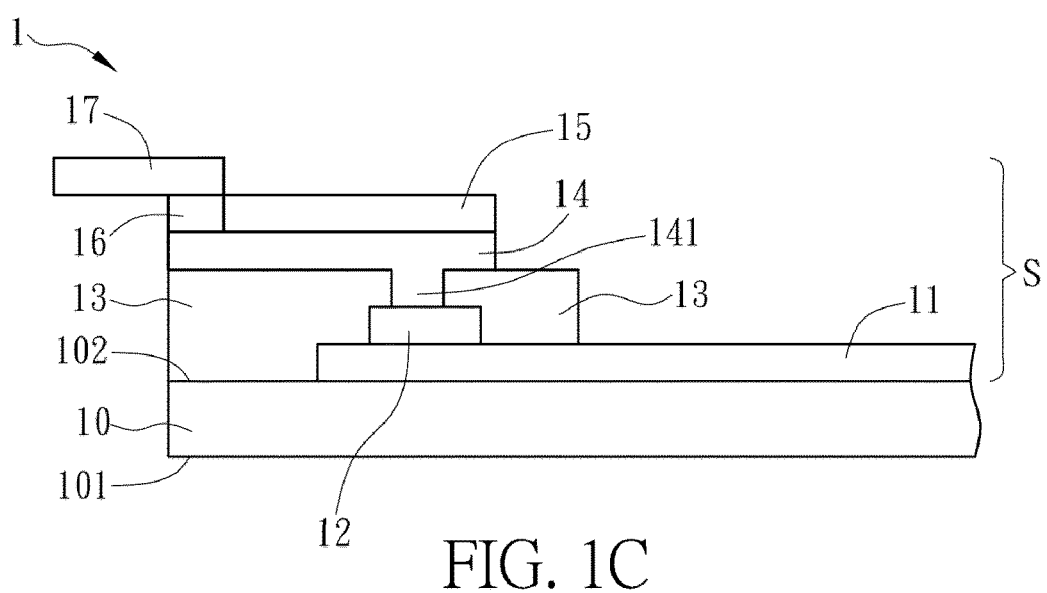

FIG. 1A-FIG. 1C illustrate schematic diagrams of a touch panel 1 according to a preferred embodiment of the present invention. As shown in FIG. 1A, the touch panel 1 includes a substrate 10 and a sensing circuit structure S. The substrate 10 is taken as a cover and the sensing circuit structure S is formed on the substrate 10. The sensing circuit structure S includes a transparent conductive layer 11, a conductive decorative pad 12 and a decorative layer 13. The transparent conductive layer 11 is formed on the substrate 10. The conductive decorative pad 12 is formed on the transparent conductive layer 11. The decorative layer 13 is formed on the transparent conductive layer 11 and the conductive decorative pad 12, and has an opening 131 on the conductive decorative pad 12. The substrate 10 may be a substrate or a film, and a material of the substrate 10 may include a glass. For example, the substrate 10 may be a glass substrate. When the substrate 10 is the film, the touch panel 1 may be a flexible touch panel.

For example, since the sensing circuit structure S is formed on the substrate 10, the touch function may be provided. Besides, since the touch panel 1 is operated on an outer surface of the substrate 10, the substrate 10 may cover the sensing circuit structure S and other components, such that the sensing circuit structure S and the other components are not exposed to the outside or directly contacted with the outside. Meanwhile, since the substrate 10 also has a certain degree of structural strength, the substrate 10 may be directly taken as the cover to provide the protective function.

The sensing circuit structure S may be sequentially formed on the substrate 10 according to the following steps:

Form the transparent conductive layer 11 on the substrate 10;

Form the conductive decorative pad 12 on the transparent conductive layer 11; and Form the decorative layer 13 on the conductive decorative pad 12, wherein the decorative layer 13 has the opening 131 on the conductive decorative pad 12.

The transparent conductive layer 11 defines touch sensing circuits by a pattern etching process. The transparent conductive layer 11 has a material such as indium tin oxide (ITO), and the decorative layer 13 has a material such as an insulation material. The transparent conductive layer 11 defines a plurality of wires as the touch sensing circuits on a touch input region of the touch panel 1, and the transparent conductive layer 11 in the touch input region is not covered by the decorative layer 13.

The outer surface 101 of the substrate 10 is provided for a user to operate. The user usually watches the touch panel 1 through the outer surface 101 and performs an operation on the outer surface 101. The remaining layers and components of the touch panel 1 are formed on the inner surface 102 of the substrate 10.

As shown in FIG. 1B, the sensing circuit structure S includes a non-transparent conductive layer 14. The non-transparent conductive layer 14 is formed on the decorative layer 13, and is electrically connected with the transparent conductive layer 11 via the opening 131. A material of the non-transparent conductive layer 14 may be silver glue. The non-transparent conductive layer 14 may define fine circuits via a screen printing equipment with a screen printing plate of the fine circuits to print on the decorative layer 13. A part 141 of the non-transparent conductive layer 14 is filled into the opening 131 and is connected with the transparent conductive layer 11 via the opening 131. Of course, in addition to the screen printing for defining the fine circuits on the non-transparent conductive layer 14, methods of relief printing, gravure printing or offset printing may also be applied to the present invention, and is not limited herein. The silver glue of the transparent conductive layer 14 includes nano silver or micron silver, and preferably includes conductive metals of titanium, zinc, zirconium, antimony, indium, tin, copper, molybdenum or aluminum, etc.

For example, after each layer in FIG. 1A is formed, the non-transparent conductive layer 14 is formed on the decorative layer 13. The conductive decorative pad 12 completely covers the opening 131, and since a conductive capacity of the conductive decorative pad 12 is superior to a conductive capacity of the decorative layer 13, the non-transparent conductive layer 14 is conducted with the transparent conductive layer 11 via the conductive decorative pad 12 instead of the decorative layer 13.

The non-transparent conductive layer 14 is described in detail. First, in addition to utilizing the printing technology, the non-transparent conductive layer 14 may be formed with a lithography process. Specifically, the material of the non-transparent conductive layer 14 includes a radiation-curable conductive material. The non-transparent conductive layer 14 is formed by utilizing a radiation to irradiate the radiation-curable conductive material for curing a part of the radiation-curable conductive material. Then, the non-transparent conductive layer is formed after an incurable radiation-curable conductive material is removed by a method, such as pure water cleaning or etching, etc. As a result, in addition to maintaining the quick and easy advantages of the printing process, the patterns of the fine circuits are formed with smaller line widths and narrower line spacing. Additionally, for a better effect of the overall process, a curable part of the radiation-curable conductive material may be cured by setting a mask on the radiation-curable conductive material to selectively cure the radiation-curable conductive material. According to an embodiment, the radiation may be ultraviolet.

Furthermore, the above radiation-curable conductive material includes a radiation-curable conductive material of a photosensitive type and is not limited to a special composition, and may be any one material, which has certain conductivity and has drying or curing properties as the material is exposed to light especially to a short wavelength radiation.

A shape and a color of the conductive decorative pad 12 are arbitrary, and the color of the conductive decorative pad 12 is not limited to a particular color. For a preferred effect, the color of the conductive decorative pad 12 is similar to the color of the decorative layer 13. Thus, when the user looks the touch panel 1 through the outer surface 101, the user is not easy to perceive a difference between the conductive decorative pad 12 and the decorative layer 13. The part 141 of the non-transparent conductive layer 14 is formed on the opening 131. In a preferred condition, the opening 131 should be completely filled with the material of the non-transparent conductive layer 14. Even if the opening 131 is not completely filled with the material of the non-transparent conductive layer 14 and a part of the opening 131 is not filled with anything, the user still may not perceive the generated color difference. Since the opening 131 is covered by the conductive decorative pad 12, when the user watches the touch panel 1 through the outer surface 101, the user may not perceive the color difference due to the unfilled opening 131, so as to compensate an alignment error of the manufacturing process.

For example, the conductive decorative pad 12 has a material such as carbon, nano copper, nano silver, or a conductive polymer resin, etc., the decorative layer 13 has a material such as various color inks with insulation, and both are not limited herein. Besides, the non-transparent conductive layer 14 does not exceed the decorative layer 13, and the material of the non-transparent conductive layer 14 may be metal.

As shown in FIG. 1C, the sensing circuit structure S further includes an insulation layer 15, a conductive bonding object 16, and a pin 17. The insulation layer 15 is formed on the non-transparent conductive layer 14, and the conductive bonding object 16 bonds the pin 17 and the non-transparent conductive layer 14.

For example, the insulation layer 15 is covered on the non-transparent conductive layer 14 by screen printing, so as to protect the non-transparent conductive layer 14 from oxidizing due to exposure to the air. The pin 17 may be a pin of a flexible printed circuit board (FPC) and is bonded and fixed on the non-transparent conductive layer 14 next to the insulation layer 15 by the conductive bonding object 16. The pin 17 is electrically connected with the transparent conductive layer 11 through the conductive bonding object 16 and the non-transparent conductive layer 14. The conductive bonding object 16 may be anisotropic conductive film (ACF) or anisotropic conductive paste (ACP).

Figure 2A:
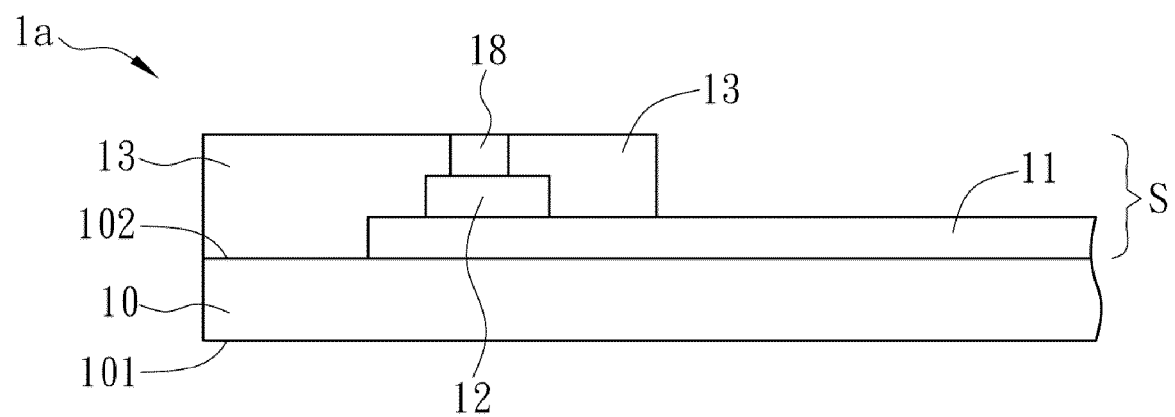
FIG. 2A-FIG. 2B illustrate schematic diagrams of a touch panel according to a preferred embodiments of the present invention.
Figure 2B:
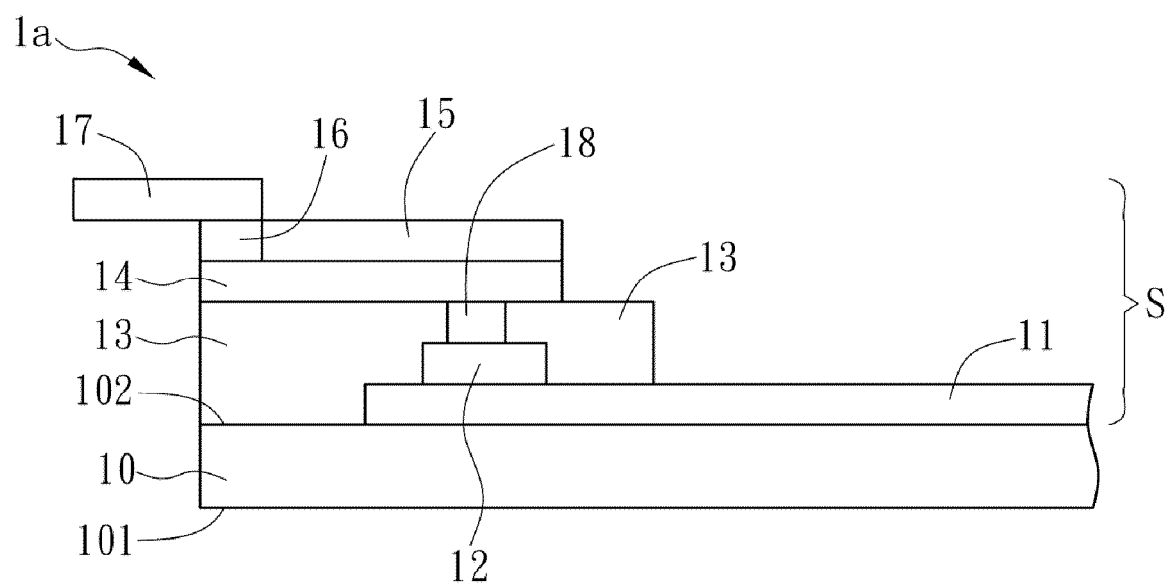

FIG. 2A-FIG. 2B illustrate schematic diagrams of a touch panel 1a according to a preferred embodiments of the present invention. As shown in FIG. 2A, the transparent conductive layer 11 is formed on the substrate 10. The conductive decorative pad 12 is formed on the transparent conductive layer 11. The decorative layer 13 is formed on the transparent conductive layer 11 and the conductive decorative pad 12, and the decorative layer 13 has an opening 131 on the conductive decorative pad 12. A conductive filler 18 is formed in the opening 131. The structure and manufacturing process of the transparent conductive layer 11, the conductive decorative pad 12, and the decorative layer 13 are similar to FIG. 1A.

As shown in FIG. 2B, the non-transparent conductive layer 14 is formed on the decorative layer 13 and the conductive filler 18. That is, the conductive filler 18 is first filled into the opening 131, and then the non-transparent conductive layer 14 is formed on the decorative layer 13 and the conductive filler 18. Next, similar to FIG. 1C, the insulation layer 15 is formed on the non-transparent conductive layer 14, and the conductive bonding object 16 bonds the pin 17 and the non-transparent conductive layer 14.

Figure 3A:
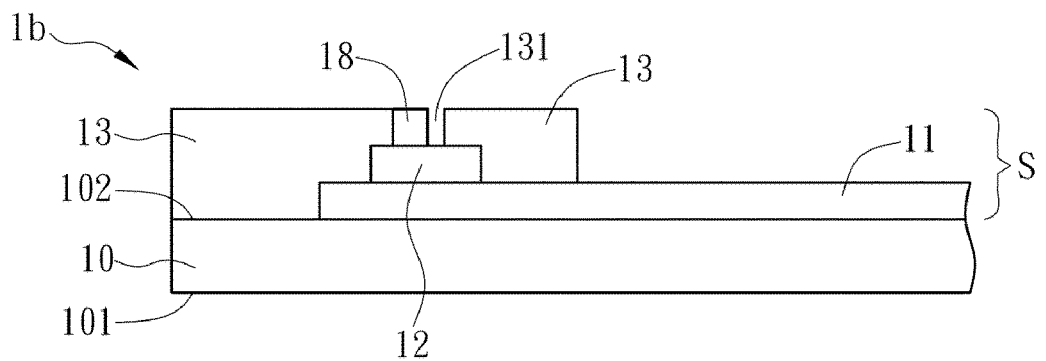
FIG. 3A-FIG. 3C illustrate schematic diagrams of a touch panel according to a preferred embodiments of the present invention.
Figure 3B:
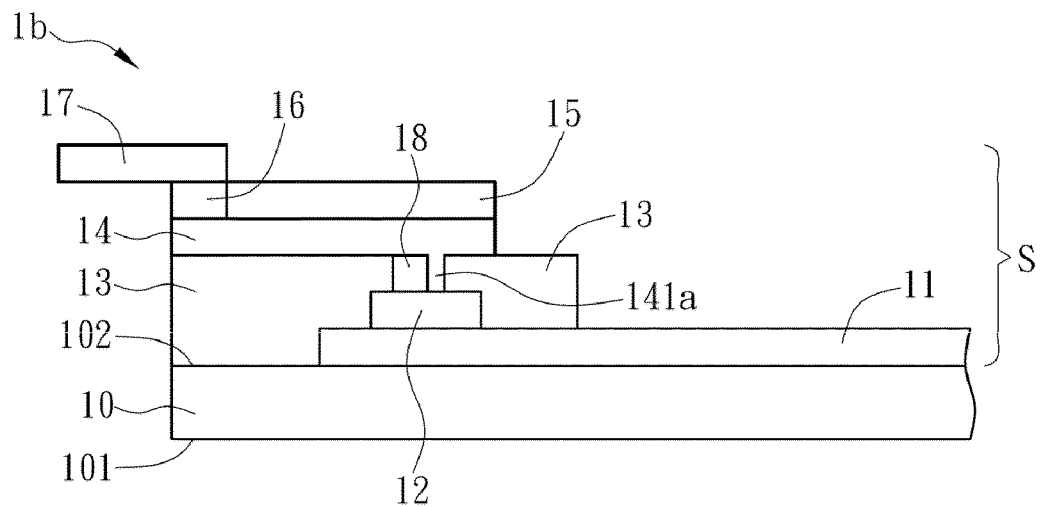

FIG. 3A-FIG. 3B illustrate schematic diagrams of a touch panel 1b according to a preferred embodiments of the present invention. As shown in FIG. 3A, the transparent conductive layer 11 is formed on the substrate 10. The conductive decorative pad 12 is formed on the transparent conductive layer 11. The decorative layer 13 is formed on the transparent conductive layer 11 and the conductive decorative pad 12, and the decorative layer 13 has the opening 131 on the conductive decorative pad 12. The conductive filler 18 is formed on the opening 131 and is not completely filled into the opening 131. The structure and manufacturing process of each layer are similar to FIG. 1A.

As shown in FIG. 3B, the non-transparent conductive layer 14 is formed on the decorative layer 13 and the conductive filler 18, and a part 141a of the non-transparent conductive layer 14 is filled into a space of the opening 131, which is not filled with the conductive filler 18. That is, the conductive filler 18 is first filled into the opening 131, and then the non-transparent conductive layer 14 is formed on the decorative layer 13 and the conductive filler 18. At the same time, the non-transparent conductive layer 14 is also filled into the unfilled space of the opening 131. Next, similar to FIG. 1C, the insulation layer 15 is formed on the non-transparent conductive layer 14, and the conductive bonding object 16 bonds the pin 17 and the non-transparent conductive layer 14.

Howsoever, since the conductive decorative pad 12 is formed on the substrate 10, when the user looks the touch panel 1b through the outer surface 101, the opening 131, the non-transparent conductive layer 14, or the conductive filler 18 may not be perceived by the user and the alignment error of the process may also be compensated.

In the above embodiment, when the substrate is the film, the touch panel may be a touch panel with a flexible characteristic, or namely a flexible touch panel. When the substrate is the glass, the touch panel may be a touch panel with a rigid characteristic or namely a rigid touch panel. Of course, when the substrate is a soft glass, the touch panel still has the flexible characteristic.

In the above embodiments, the touch panels 1, 1a, and 1b may merely have only one substrate, and the substrate 10 has three functions for first, forming the sensing circuit structure S; second, directly serving as the cover; third, shielding the internal circuits and components. Therefore, since the touch panels 1, 1a, 1b do not require configuring another substrate, the overall thickness of each panel is thinner and the overall light transmittance thereof may be superior due to the thinner thickness of the panel. Additionally, since only one substrate is utilized, bonding the two substrates is not required. The problem of yield loss caused by the bonding process is not appeared, so the production yield may be improved. Moreover, since the required process and auxiliary material, such as transparent plastic, film or glass cover, for bonding may be decreased, the manufacturing cost may be reduced. Besides, in the manufacturing cost, since one substrate and an optical layer are not utilized, the cost may be lower. In the above embodiment, the opening is utilized for directly or indirectly electrically connecting the non-transparent conductive layer and the transparent conductive layer. Since the opening of the decorative layer is located on the conductive decorative pad above the transparent conductive layer, the conductive decorative pad and the decorative layer may cover the border circuits to avoid visual exposedness to outside, such that the border circuits are not perceived by the user. In addition, the touch panel and related manufacturing method of the present invention only utilize the single plate and facilitate the thinning of the product.

Figure 3C:
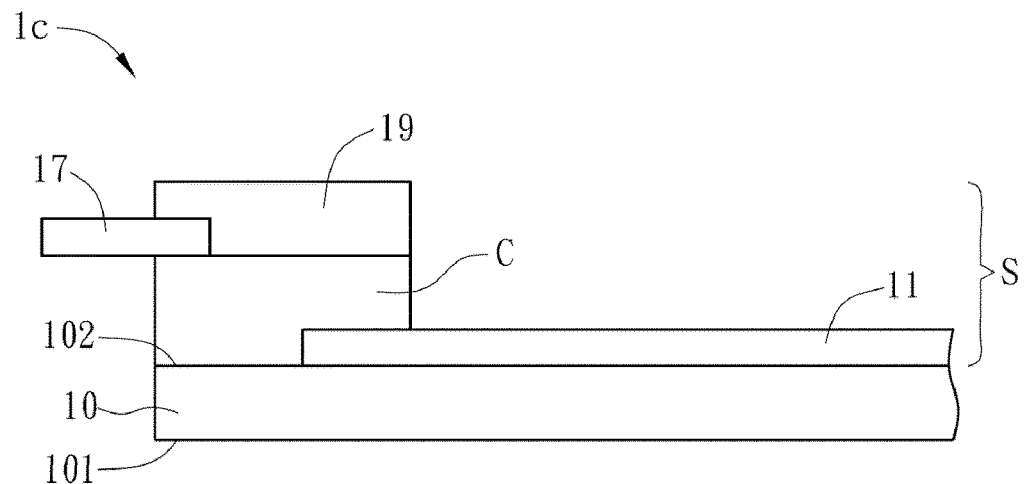

FIG. 3C illustrates a schematic diagram of a touch panel 1c according to another preferred embodiments of the present invention. The touch panel 1c is substantially similar to the above touch panels 1, 1a, 1b, except that the touch panel 1c further includes a shielding structure 19. The shielding structure 19 is formed on the substrate 10, and in the embodiment, the shielding structure 19 is formed on the substrate 10 by forming on the sensing circuit structure S. The shielding structure 19 may be a decorative layer, and is made by printing with various color inks of insulation and may have the shielding effect. Since the shielding structure 19 is configured, the decorative layer is not required in the surrounding conductive structure C (such as the decorative layer 13 in FIG. 3B), and the processing step and cost may be saved. Preferably, the touch panel may have the shielding structure and simultaneously form the decorative layer on the sensing circuit structure to enhance the shielding effect.

Additionally, in other embodiments, the touch panel may also have a shielding body to replace the shielding structure. Besides, the difference between the shielding body and the shielding structure is that the shielding body is more three-dimensional. For example, a thickness of the shielding body is greater than that of the shielding structure, or the shielding body is formed by a specific structure.

Figure 4A:
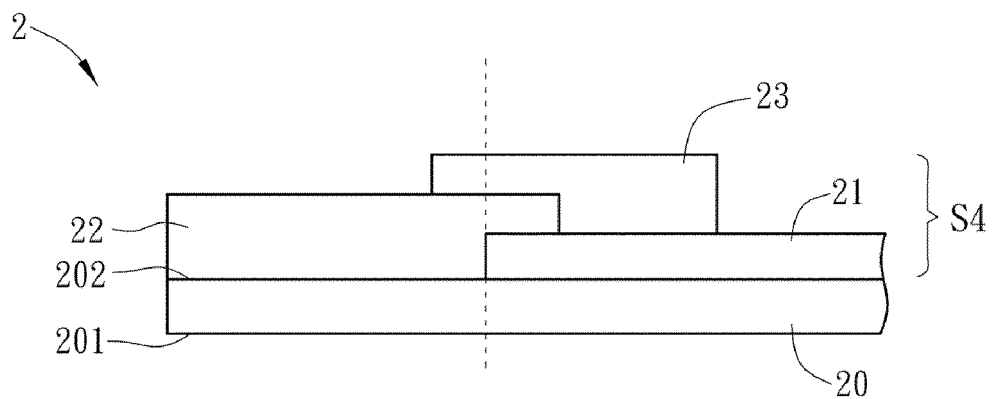
FIG. 4A-FIG. 4C illustrate schematic diagrams of a touch panel according to a preferred embodiments of the present invention.
Figure 4B:
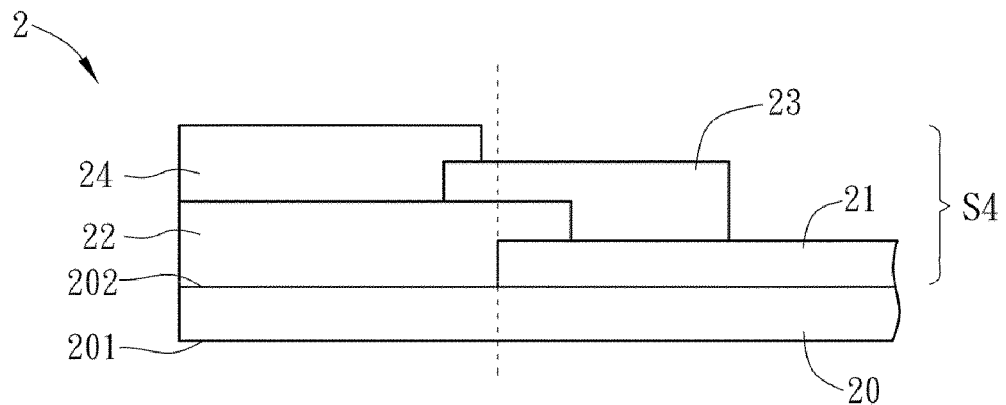
Figure 4C:
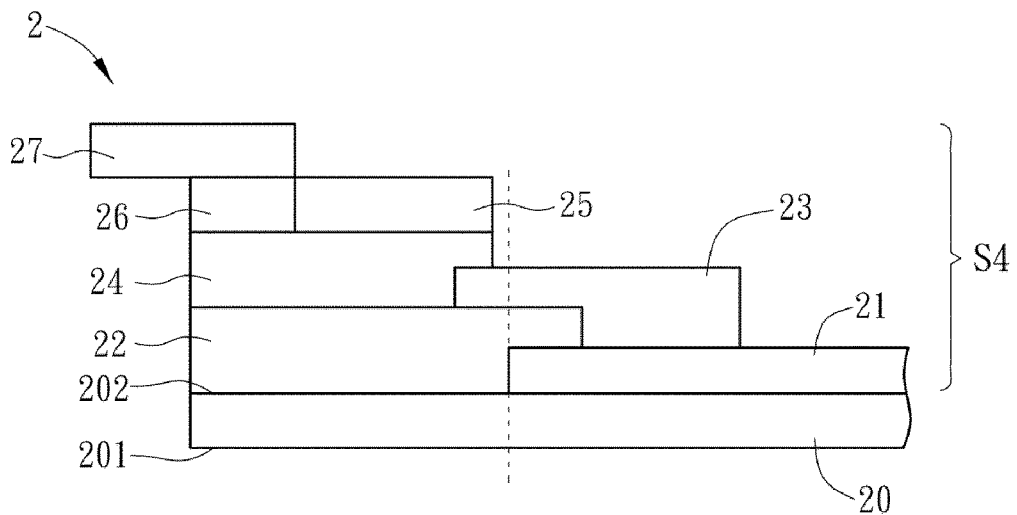

FIG. 4A-FIG. 4C illustrate schematic diagrams of a touch panel 2 according to a preferred embodiment of the present invention. As shown in FIG. 4A, the touch panel 2 includes a substrate 20 and a sensing circuit structure S4. The substrate 20 is taken as a cover, and the sensing circuit structure S4 is formed on the substrate 20. The sensing circuit structure S4 includes a transparent conductive layer 21, a shielding decorative layer 22, and a transparent conductive connection layer 23. The transparent conductive layer 21 is formed on the substrate 20, and the shielding decorative layer 22 is formed on the substrate 20 and the transparent conductive layer 21.

For example, the sensing circuit structure S4 is formed on the substrate 20, and the substrate 20 is directly taken as the cover.

The sensing circuit structure S4 may be sequentially formed on the substrate 20 according to the following steps:

Form the transparent conductive layer 21 on the substrate 20;

Form the shielding decorative layer 22 on the substrate 20 and the transparent conductive layer 21; and Form the transparent conductive connection layer 23 on the transparent conductive layer 21 and the shielding decorative layer 22, wherein the transparent conductive connection layer 23 is extended from the transparent conductive layer 21 toward the shielding decorative layer 22, exceeds an edge of the transparent conductive layer 21, and may be formed by utilizing a printing method.

The transparent conductive layer 21 defines touch sensing circuits by a pattern etching process. The transparent conductive layer 21 has a material such as indium tin oxide (ITO), and the shielding decorative layer 22 has a material such as an insulation material or various color inks with insulation. The transparent conductive connection layer 23 has a material such as a conductive polymer material or indium tin oxide, and the conductive polymer material is as a conductive ink. The transparent conductive connection layer 23 may be formed on the transparent conductive layer 21 and the shielding decorative layer 22 by utilizing the printing method. The transparent conductive layer 21 defines a plurality of wires as the touch sensing circuits on a touch input region of the touch panel 2, and the transparent conductive layer 21 in the touch input region is not covered by the shielding decorative layer 22.

An outer surface 201 of the substrate 20 is provided for the user to operate. The user usually watches the touch panel 2 through the outer surface 201 and performs an operation on the outer surface 201. The remaining layers and components of the touch panel 2 are formed on an inner surface 202 of the substrate 20.

As shown in FIG. 4B, the touch panel 2 includes a non-transparent conductive layer 24. The non-transparent conductive layer 24 is formed on the shielding decorative layer 22 and the transparent conductive connection layer 23, and is not formed on the transparent conductive layer 21. A material of the non-transparent conductive layer 24 may be silver glue. The non-transparent conductive layer 24 may defines fine circuits via a screen printing equipment with a screen printing plate of the fine circuits to print on the shielding decorative layer 22. Additionally, the material of the non-transparent conductive layer 24 may also include metal, such as copper, molybdenum, or aluminum, etc, and the copper wires, the aluminum or molybdenum wires are formed by a sputtering process. The non-transparent conductive layer 24 formed on the shielding decorative layer 22 is extended toward the transparent conductive layer 21 and does not exceed an edge of the transparent conductive layer 21.

For example, after each layer in FIG. 4A is formed, the non-transparent conductive layer 24 is formed on the shielding decorative layer 22 and the transparent conductive connection layer 23, and the non-transparent conductive layer 24 is not formed on the transparent conductive layer 21. Thus, the non-transparent conductive layer 24 may be conducted with the transparent conductive layer 21 via the transparent conductive connection layer 23.

As shown in FIG. 4C, the touch panel 2 further includes an insulation layer 25, a conductive bonding object 26, and a pin 27. The insulation layer 25 is formed on the non-transparent conductive layer 24, and the conductive bonding object 26 bonds the pin 27 and the non-transparent conductive layer 24.

For example, the insulation layer 25 is covered on the non-transparent conductive layer 24 by screen printing, so as to protect the non-transparent conductive layer 24 from oxidizing due to exposure to the air. The pin 27 may be a pin of a flexible printed circuit board (FPC) and is bonded and fixed on the non-transparent conductive layer 24 next to the insulation layer 25 by the conductive bonding object 26. The pin 17 is electrically connected with the transparent conductive layer 21 through the conductive bonding object 26 and the non-transparent conductive layer 24. The conductive bonding object 16 may be anisotropic conductive film (ACF) or anisotropic conductive paste (ACP).

Figure 5A:
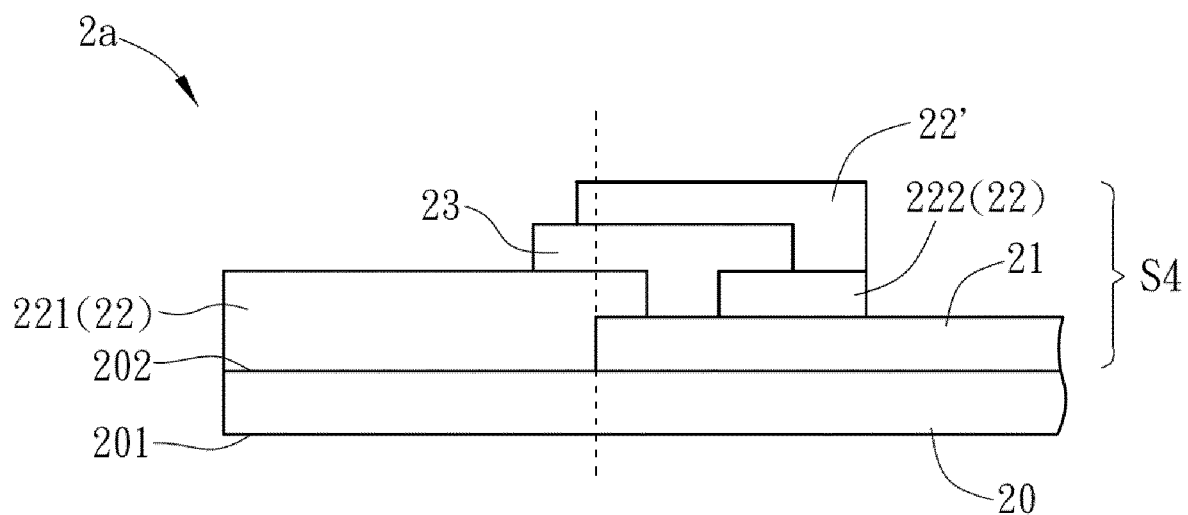
FIG. 5A-FIG. 5B illustrate schematic diagrams of a touch panel according to a preferred embodiments of the present invention.
Figure 5B:
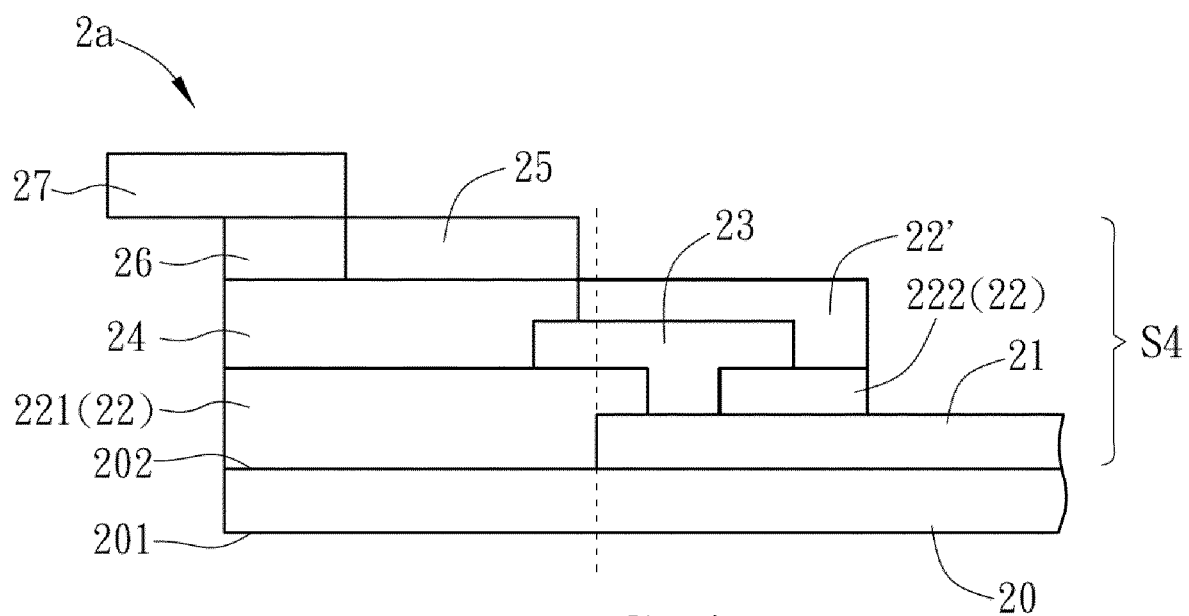

FIG. 5A-FIG. 5B illustrate schematic diagrams of a touch panel 2a according to a preferred embodiments of the present invention. As shown in FIG. 5A, the transparent conductive layer 21 is formed on the substrate 20 and the shielding decorative layer 22 is formed on the substrate 20 and the transparent conductive layer 21. The shielding decorative layer 22 has an opening, a first part 221, and a second part 222. The opening is located on the transparent conductive layer 21 and between the first part 221 and the second part 222. The transparent conductive connection layer 23 is filled into the opening and contacted with the transparent conductive layer 21. The structure and manufacturing process of the transparent conductive layer 21, the shielding decorative layer 22, and the transparent conductive connection layer 23 are similar to FIG. 5A. Another shielding decorative layer 22' is formed above the opening of the shielding decorative layer 22. The shielding decorative layer 22' is at least formed on the transparent conductive connection layer 23 to cover the opening of the shielding decorative layer 22, so as to prevent light piercing from a side of the touch panel 2 to another side of the touch panel 2 through the opening.

In the embodiment, the shielding decorative layer 22' is formed on the shielding decorative layer 22 and the transparent conductive connection layer 23. A side of the shielding decorative layer 22' is extended toward the first part 221 and exceeds an edge of the transparent conductive layer 21 but does not exceed an edge of the transparent conductive connection layer 23, so as to limit the forming location of the following non-transparent conductive layer 24. Another side of the shielding decorative layer 22' is extended toward the second part 222 and doesn't not exceed an edge of the shielding decorative layer 22.

Colors of the decorative layers 22 and 22' may be the same or similar to avoid the user seeing the opening of the shielding decorative layer 22 or perceiving a color difference between the transparent conductive connection layer 23 and the shielding decorative layer 22. Additionally, the decorative layers 22 and 22' may also have the different colors, and/or different brightness. The opening of the shielding decorative layer 22 may be designed into a specific pattern, such as texts or marks related to the product, or texts or marks related to the manufacturer, etc. The texts or marks are displayed by the shielding decorative layer 22', and if a contrast between the decorative layers 22 and 22' is more obvious, the texts or marks are more obvious.

As shown in FIG. 5B, the non-transparent conductive layer 24 is formed on the shielding decorative layer 22 and the transparent conductive connection layer 23. That is, the transparent conductive connection layer 23 is first filled into the opening between the first part 221 and second part 222, and then the non-transparent conductive layer 24 is formed on the shielding decorative layer 22 and the transparent conductive connection layer 23. The structure and manufacturing process of the non-transparent conductive layer 24 are similar to FIG. 5B. In the embodiment, the non-transparent conductive layer 24 is formed next to the shielding decorative layer 22. Even if the non-transparent conductive layer 24 is not accurately formed next to the shielding decorative layer 22 due to a processing error, for example, a part of the non-transparent conductive layer 24 is formed on the shielding decorative layer 22' or a gap is formed between the non-transparent conductive layer 24 and the shielding decorative layer 22', these drawbacks may be covered by the decorative layers 22 and 22' and may not be perceived by the user.

Additionally, a sequence for forming the shielding decorative layer 22' and the non-transparent conductive layer 24 may be interchangeable. As shown in FIG. 5A, the transparent conductive layer 21 is formed on the substrate 20 and the shielding decorative layer 22 is formed on the substrate 20 and the transparent conductive layer 21. The shielding decorative layer 22 has an opening, the first part 221, and the second part 222. The opening is located on the transparent conductive layer 21 and between the first part 221 and the second part 222. The transparent conductive connection layer 23 is filled into the opening and contacted with the transparent conductive layer 21. At this moment, the shielding decorative layer 22' is not formed first. As shown in FIG. 5B, the non-transparent conductive layer 24 is first formed on the shielding decorative layer 22 and the transparent conductive connection layer 23, and then the shielding decorative layer 22' is formed on the opening of the shielding decorative layer 22. The shielding decorative layer 22' is at least formed on the transparent conductive connection layer 23 to cover the opening of the shielding decorative layer 22. In the embodiment, the shielding decorative layer 22' is formed next to the non-transparent conductive layer 24.

Next, similar to FIG. 4C, the insulation layer 25 is formed on the non-transparent conductive layer 24, and the conductive bonding object 26 bonds the pin 27 and the non-transparent conductive layer 24.

Howsoever, since the non-transparent conductive layer 24 is formed on the shielding decorative layer 22 and does not exceed the edge of the transparent conductive layer 21, and other external non-transparent components for connecting also do not reach the edge of the transparent conductive layer 21, the non-transparent conductive layer 24 and the other external non-transparent components for connecting are not located above the transparent conductive layer 21. Thus, when the user watches the touch panel 2, 2a through the outer surface 201, the user may not perceive the non-transparent components in the region of the transparent conductive layer 21. Since the transparent conductive connection layer 23 is transparent, the color of the decorative layer is not required corresponding to the color of the transparent conductive connection layer 23, and may be arbitrary, which does not affect the user to watch as well. Moreover, the shielding decorative layer 22 may cover the border circuits, for example, to cover the circuits formed on the non-transparent conductive layer 24. Thus, when the user looks toward the border circuits, the user may look the shielding decorative layer 22 instead of the border circuits, and may not perceive the color difference between the border circuits and the other components, such that the touch panel with no color difference of the border circuit is achieved.

In the above embodiment, when the substrate is the film, the touch panel may be a touch panel with a flexible characteristic, or namely a flexible touch panel. When the substrate is the glass, the touch panel may be a touch panel with a rigid characteristic or namely a rigid touch panel. Of course, when the substrate is a soft glass, the touch panel still has the flexible characteristic.

In the above embodiment, the touch panels 2 and 2a merely have only one substrate, and the substrate 20 has three functions for first, forming the sensing circuit structure S4; second, directly serving as the cover; third, shielding the border circuits. Therefore, since the touch panels 2, 2a do not require configuring another substrate, the overall thickness of the panel is smaller and the overall light transmittance may be superior due to the smaller thickness of the panel. Additionally, since only one substrate is utilized, bonding the two substrates is not required. The problem of yield loss caused by the bonding process is not appeared, so the production yield may be improved. Moreover, since the required process and auxiliary material, such as transparent plastic, film or glass cover, for bonding may be decreased, the manufacturing cost may be reduced. Besides, in the manufacturing cost, since one substrate and an optical layer are not utilized, the cost may be lower.

The transparent conductive connection layer is extended from the transparent conductive layer toward the shielding decorative layer and exceeds the edge of the transparent conductive layer. The non-transparent conductive layer is formed on the transparent conductive connection layer and is not formed above the transparent conductive layer. Therefore, the shielding decorative layer may cover the non-transparent conductive layer 24 served for the border circuits to avoid visual exposedness, such that the user may not perceive the border circuits. In addition, the touch panel and related manufacturing method of the present invention only utilize the single plate and facilitate the thinning of the product.

The description of the three functions for the single plate may be referred to the aforementioned embodiment, and is not narrated hereinafter. Emphatically, the covering function of the three functions may be achieved by the decorative layer, the shielding structure, the shielding body, or any combination thereof in the sensing circuit structure.

In the above embodiment, the produced touch panel with the single plate may be combined with a display panel, that is, a side of the sensing circuit structure is formed on the touch panel and another side of the sensing circuit structure is combined with the display panel. The sensing circuit structure is formed between the touch panel and the display panel. For example, the sensing circuit structure may be coated with an optical adhesive layer, and the optical adhesive layer is utilized for combining the touch panel and the display panel. Note that, the optical adhesive is not utilized for combining the touch panel with another substrate, because the touch panel only has a single substrate.

Figure 6A:
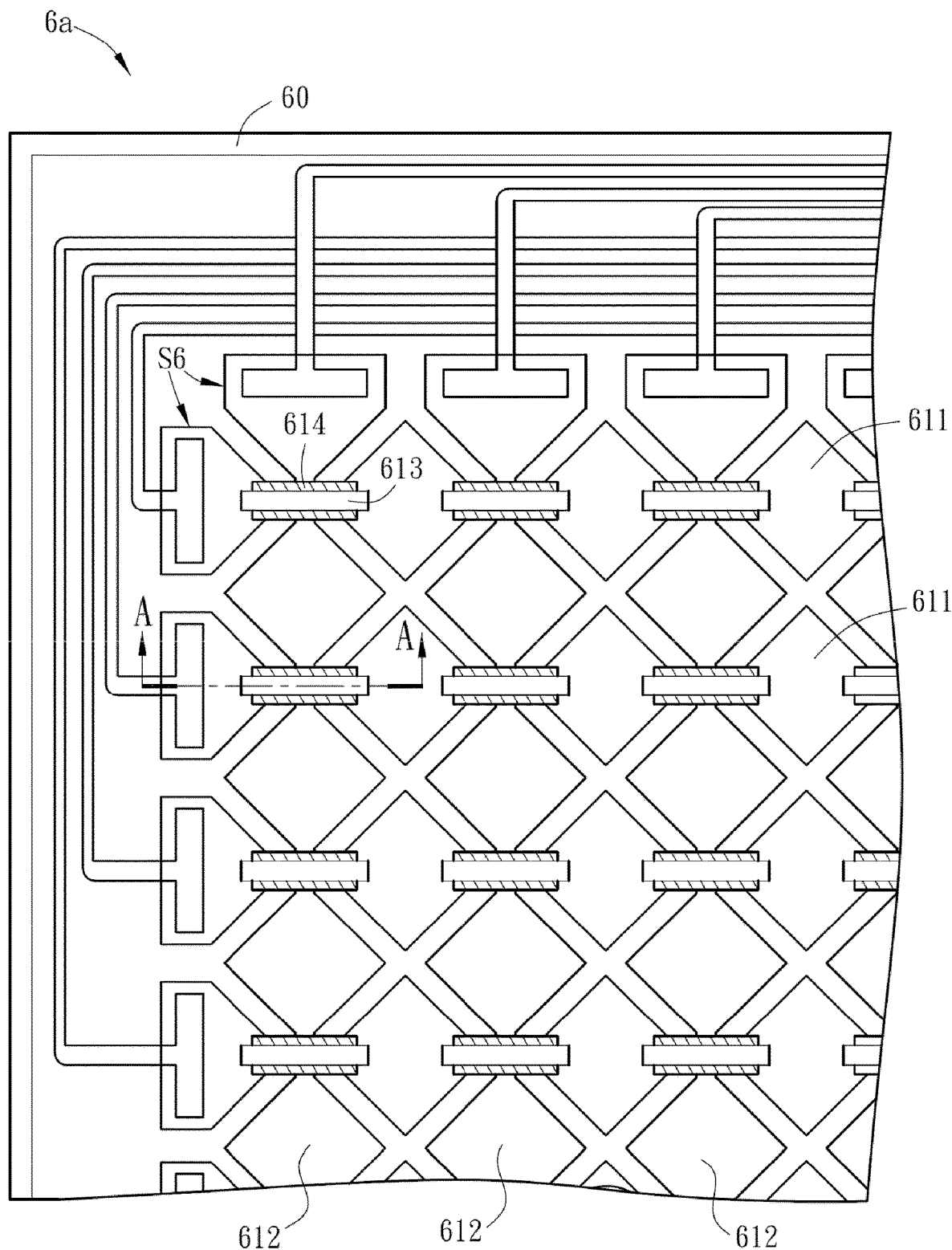
FIG. 6A illustrates a top view diagram of a touch panel according to a preferred embodiment of the present invention.
Figure 6B:
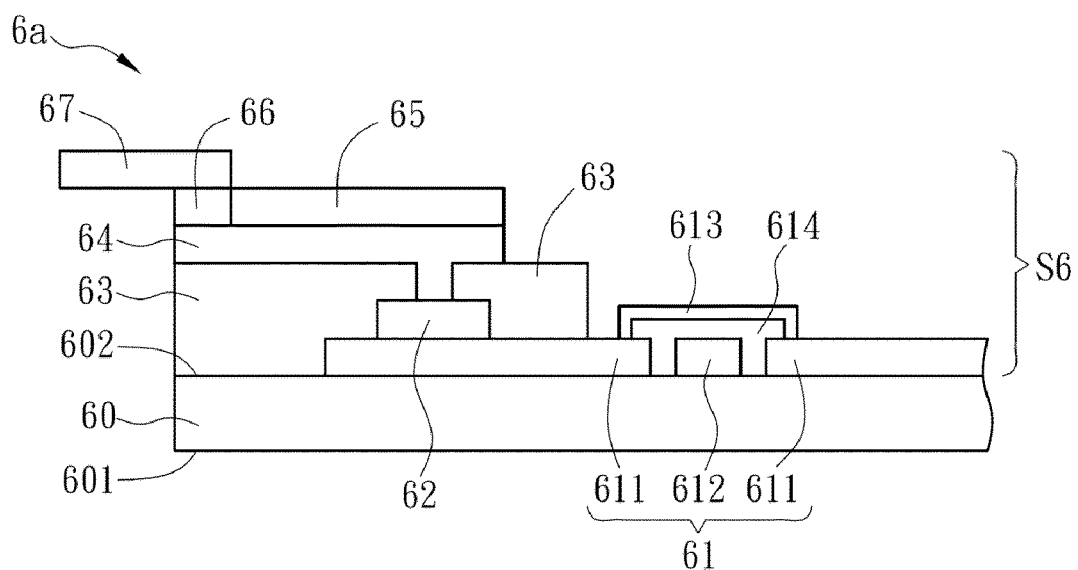
FIG. 6B illustrates a side-view diagram of a section line A-A in FIG. 6A.

Additionally, according to a creation of the single substrate in the present invention, the transparent conductive layer may have different detailed structures. First, please refer to FIGS. 6A and 6B. FIG. 6A illustrates a top view diagram of a touch panel according to a preferred embodiment of the present invention. FIG. 6B illustrates a side-view diagram of a section line A-A in FIG. 6A. The touch panel 6a is substantially similar to the above touch panel, except that a transparent conductive layer 61 of a sensing circuit structure S6 includes a plurality of first transparent conductive units 611 and a plurality of second transparent conductive units 612. The first transparent conductive unit 611 and the second transparent conductive unit 612 are formed on a same side of the substrate 60 (such as an inner surface 602), and the first transparent conductive unit 611 and the second transparent conductive unit 612 respectively have an extending direction perpendicular to each other (such as X-axis and Y-axis directions in FIG. 6A). Besides, the first transparent conductive unit 611 is connected by the bridging part 613. Please refer to FIG. 6B, an insulation part 614 is formed between the bridging part 613 and the second transparent conductive unit 612 in order to avoid mutual interference.

Figure 6C:
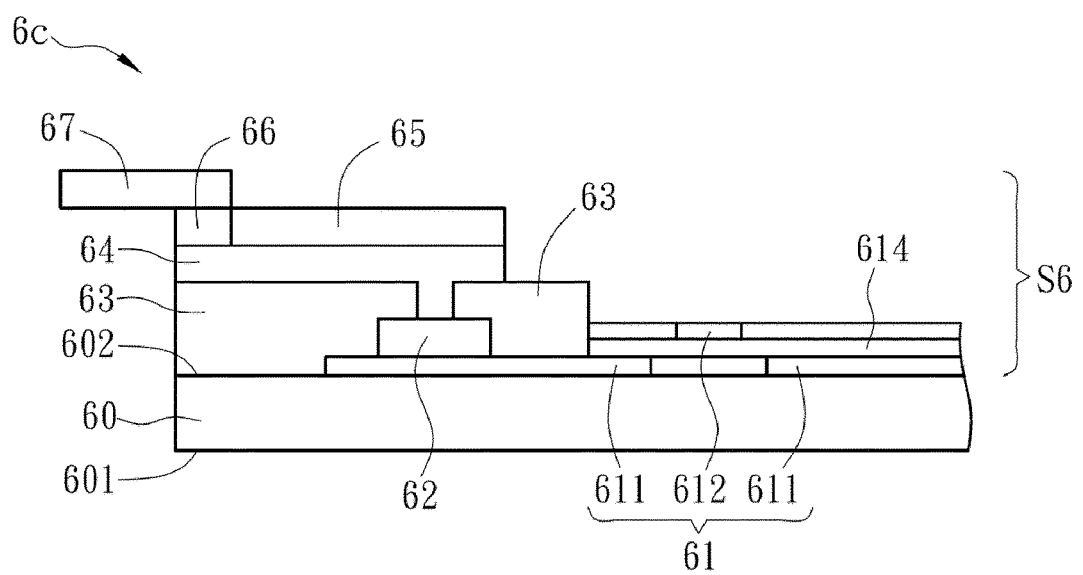
FIG. 6C illustrates a sectional diagram of a touch panel according to a preferred embodiment of the present invention.

FIG. 6C illustrates a sectional diagram of a touch panel according to a preferred embodiment of the present invention. The structure in FIG. 6C is substantially similar to the structure in FIG. 6B, except that though the first transparent conductive unit 611 and the second transparent conductive unit 612 are formed on the same side of the substrate 60, a whole layer of the insulation part 614 is formed between the first transparent conductive unit 611 and the second transparent conductive unit 612. The insulation part 614 may also have the insulation effect between the first transparent conductive unit 611 and the second transparent conductive unit 612 to avoid the interference.

Figure 7A:
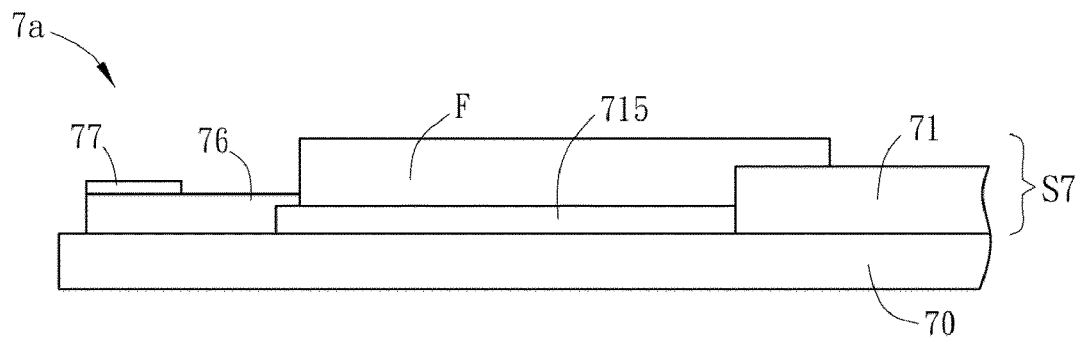
FIG. 7A-FIG. 7B illustrate schematic diagrams of touch panels according to another preferred embodiments of the present invention.
Figure 7B:
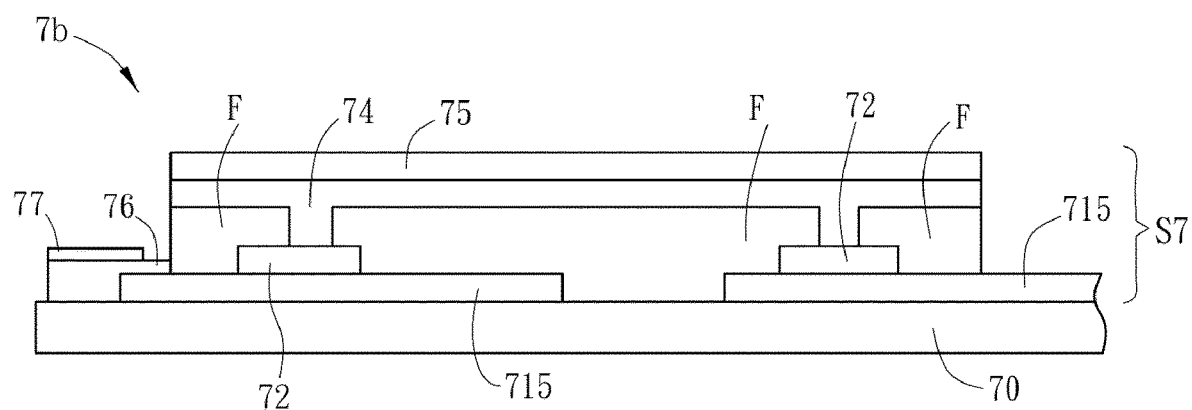

FIG. 7A-FIG. 7B illustrate schematic diagrams of touch panels according to another preferred embodiments of the present invention. Please refer to FIG. 7A. A sensing circuit structure S7 is formed on the substrate 70. The sensing circuit structure S7 includes a transparent conductive layer 71, a transparent conductive connection part 715, a conductive bonding object 76, and a pin 77. Besides, the conductive bonding object 76 is formed on the substrate 70 and a terminal of the transparent conductive connection part 715, to bond the pin 77 to the substrate 70 and be conducted with a terminal of the transparent conductive connection part 715. Thereby, the pin 77 is electrically connected with the transparent conductive layer 71 by the transparent conductive connection part 715, so as to transmit touch signals. The shielding layer F is formed on the transparent conductive layer 71 and the transparent conductive connection part 715 to avoid a transmittance difference between the transparent conductive layer 71 and the transparent conductive connection part 715 to generate a visual difference.

Additionally, please also refer to FIG. 7B. The structure in FIG. 7B is substantially similar to the structure in FIG. 1C, except that two conductive decorative pads 72 are provided and the conductive bonding object 76 is formed on the substrate 70 and the terminal of the transparent conductive connection part 715. Therefore, the conductive bonding object 76 bonds the pin 77 to the substrate 70 and is conducted with the terminal of the transparent conductive connection part 715 to electrically connected with the pin 77 and the transparent conductive layer 71 by the transparent conductive connection part 715, the conductive decorative pad 72, the non-transparent conductive layer 74, and the another conductive decorative pad 72 sequentially. The insulation layer 75 is formed on the most upper side and has the effect of protecting the lower structure.

In the above two embodiments, the structure of the pin 77 is modified from a stacking type on the upper side of the sensing circuit structure S7 to an extensive type close to the substrate 70, so as to have the effect of decreasing the thickness of the touch panels 7a and 7b.

In summary, according to the touch panel with the single plate and the manufacturing method of the present invention, the substrate is utilized for forming the sensing circuit structure to provide a traditional touch function. Moreover, a disposing location of the single plate in the touch panel is located on the operating side and may be directly taken as the cover, such that the circuits and components covered by the single plate may not be exposed to the outside to have the protective effect. Additionally, in the embodiment, the sensing circuit structure formed on the substrate may also have the shielding function, or the shielding structure or the shielding body may also be formed on the other substrate. Therefore, when the substrate covers the border circuits and other components, which are not desired to be perceived by the user, the substrate may have the shielding effect and facilitate a planarization of the touch panel.

The touch panel with the single plate and the multifunction of the present invention may be implemented by improving the structure of the substrate. In comparison with the prior art, the single plate provides the completely touch function, does not require bonding the cover film or cover lens by the bonding process, and may maintain a structural strength supported by the general touch panel. Thus, in addition to eliminating a requirement of utilizing another substrate to form the touch panel, the space and manufacturing cost of bonding the cover film or the cover lens is further saved to facilitate the thinning operation of the product, which belongs to a creative concept of forward-looking.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A touch panel with a single plate comprising:
a substrate, taken as a cover;
a sensing circuit structure, formed on the substrate and having a shielding function; and
a shielding structure, formed on the substrate;
wherein the sensing circuit structure comprises:
a transparent conductive layer, formed on the substrate;
a conductive decorative pad, formed on the transparent conductive layer;
a decorative layer, formed on the transparent conductive layer and the conductive decorative pad, and having an opening on the conductive decorative pad;
a non-transparent conductive layer, formed on the decorative layer, and electrically connected with the transparent conductive layer via the opening; and
a conductive filler, formed on the opening;
wherein a part of the non-transparent conductive layer is formed on the opening, and a material of the non-transparent conductive layer comprises a metal material or a radiation-curable conductive material.

2. The touch panel of claim 1, wherein the conductive decorative pad completely covers the opening, a conductive capacity of the conductive decorative pad is superior to a conductive capacity of the decorative layer, and a color of the conductive decorative pad is substantially the same with a color of the decorative layer.

3. The touch panel of claim 1, wherein a material of the conductive decorative pad comprises carbon, nano copper, nano silver, or conductive polymer resin, and a material of the decorative layer comprises various color inks with insulation.

4. The touch panel of claim 1, wherein the non-transparent conductive layer is formed by utilizing a radiation to irradiate the radiation-curable conductive material for curing a part of the radiation-curable conductive material and removing an incurable radiation-curable conductive material.

5. The touch panel of claim 4, wherein a curable part of the radiation-curable conductive material is made by setting a mask on the radiation-curable conductive material to selectively cure the radiation-curable conductive material.

6. The touch panel of claim 1, wherein the transparent conductive layer comprises a plurality of first transparent conductive units and a plurality of second transparent conductive units, the plurality of first transparent conductive units and the plurality of second transparent conductive units are formed on a same side of the substrate, and the plurality of first transparent conductive units and the plurality of second transparent conductive units respectively have an extending direction perpendicular to each other.

7. The touch panel of claim 1, wherein the transparent conductive layer comprises a plurality of first transparent conductive units and a plurality of second transparent conductive units, the plurality of first transparent conductive units and the plurality of second transparent conductive units are formed on a same side of the substrate, and the plurality of first transparent conductive units and the plurality of second transparent conductive units respectively have an extending direction perpendicular to each other.

8. The touch panel of claim 1, wherein the sensing circuit structure comprises a transparent conductive layer and a touch sensing circuit is defined in the transparent conductive layer.

9. A touch panel with a single plate comprising: a substrate, taken as a cover; a sensing circuit structure, formed on the substrate and having a shielding function; and a shielding structure, formed on the substrate; wherein the sensing circuit structure comprises: a transparent conductive layer, formed on the substrate; a shielding decorative layer, formed on the substrate and the transparent conductive layer; a transparent conductive connection layer, directly formed on the transparent conductive layer and the shielding decorative layer, extended from the transparent conductive layer toward the shielding decorative layer, and exceeding an edge of the transparent conductive layer; and a non-transparent conductive layer, directly formed on the shielding decorative layer and the transparent conductive connection layer, and the non-transparent conductive layer is not formed on the transparent conductive layer, wherein the shielding decorative layer has an opening on the transparent conductive layer, the transparent conductive connection layer is filled into the opening, and the sensing circuit structure further comprise: another shielding decorative layer, formed on the transparent conductive layer to cover the opening.

10. The touch panel of claim 9, wherein the non-transparent conductive layer formed on the shielding decorative layer is extended toward the transparent conductive layer and does not exceed the edge of the transparent conductive layer.

11. The touch panel of claim 9, wherein a material of the shielding decorative layer comprises various color inks with insulation, a material of the transparent conductive layer comprises conductive polymer resin or indium tin oxide, and a material of the non-transparent conductive layer comprises silver glue, copper, molybdenum, or aluminum.

12. The touch panel of claim 9, wherein a material of the non-transparent conductive layer comprises a metal material or a radiation-curable conductive material.

13. The touch panel of claim 12, wherein the non-transparent conductive layer is formed by utilizing a radiation to irradiate the radiation-curable conductive material for curing a part of the radiation-curable conductive material and removing an incurable radiation-curable conductive material.

14. The touch panel of claim 13, wherein a curable part of the radiation-curable conductive material is made by setting a mask on the radiation-curable conductive material to selectively cure the radiation-curable conductive material.

15. The touch panel of claim 9, wherein the transparent conductive layer comprises a plurality of first transparent conductive units and a plurality of second transparent conductive units, the plurality of first transparent conductive units and the plurality of second transparent conductive units are formed on a same side of the substrate, and the plurality of first transparent conductive units and the plurality of second transparent conductive units respectively have an extending direction perpendicular to each other.

16. The touch panel of claim 15, wherein the transparent conductive layer further comprises an insulation part formed between the plurality of first transparent conductive units and the plurality of second transparent conductive units.

17. A touch panel with a single plate comprising: a substrate, taken as a cover, wherein an outer surface of the cover is utilized for receiving a user operation; and a sensing circuit structure, formed on the substrate and having an oxidation shielding function, for transmitting the user operation; wherein the substrate is a transparent glass substrate or a transparent film; wherein the sensing circuit structure comprises: a transparent conductive layer, formed on the substrate; a shielding decorative layer, formed on the substrate and the transparent conductive layer; a transparent conductive connection layer, directly formed on the transparent conductive layer and the shielding decorative layer, extended from the transparent conductive layer toward the shielding decorative layer, and exceeding an edge of the transparent conductive layer; and a non-transparent conductive layer, directly formed on the shielding decorative layer and the transparent conductive connection layer, and the non-transparent conductive layer is not formed on the transparent conductive layer, wherein the shielding decorative layer has an opening on the transparent conductive layer, the transparent conductive connection layer is filled into the opening, and the sensing circuit structure further comprise: another shielding decorative layer, formed on the transparent conductive layer to cover the opening.

\* \* \* \* \*